(12) United States Patent
Lee et al.

(10) Patent No.: US 7,872,869 B2
(45) Date of Patent: Jan. 18, 2011

(54) ELECTRONIC CHIP MODULE

(75) Inventors: Tae Soo Lee, Gyunggi-do (KR); Yun Hwi Park, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 7 days.

(21) Appl. No.: 12/425,111

(22) Filed: Apr. 16, 2009

(65) Prior Publication Data
US 2010/0020499 A1    Jan. 28, 2010

(30) Foreign Application Priority Data
Jul. 25, 2008    (KR) .................. 10-2008-0073127

(51) Int. Cl.
*H05K 7/20* (2006.01)
(52) U.S. Cl. .................. 361/719; 361/704; 361/710
(58) Field of Classification Search .................. 361/719
See application file for complete search history.

(56) References Cited

U.S. PATENT DOCUMENTS

| | | | | |
|---|---|---|---|---|
| 4,885,126 A | * | 12/1989 | Polonio ...................... 361/757 |
| 5,471,366 A | * | 11/1995 | Ozawa ........................ 361/704 |
| 5,708,566 A | * | 1/1998 | Hunninghaus et al. ...... 361/704 |
| 5,710,459 A | * | 1/1998 | Teng et al. .................. 257/717 |
| 5,783,862 A | * | 7/1998 | Deeney ....................... 257/714 |
| 6,477,052 B1 | * | 11/2002 | Barcley ....................... 361/719 |
| 6,625,028 B1 | * | 9/2003 | Dove et al. .................. 361/707 |
| 6,696,643 B2 | * | 2/2004 | Takano ....................... 174/520 |
| 2003/0230799 A1 | * | 12/2003 | Yee et al. .................... 257/706 |

FOREIGN PATENT DOCUMENTS

| | | |
|---|---|---|
| KR | 10-1995-0000960 B1 | 2/1995 |
| KR | 10-2003-0035375 A | 5/2003 |

* cited by examiner

*Primary Examiner*—Gregory D Thompson
(74) *Attorney, Agent, or Firm*—McDermott Will & Emery LLP (57) ABSTRACT

Provided is an electron chip module having a heat sink that can increase heat dissipation efficiency. A bottom surface of a module circuit board and an upper surface of a heat sink are in direct contact with each other by using a metal wire, such that heat generated during the operation of a heat-generating device chip mounted onto the module circuit board can be effectively dissipated to the outside.

11 Claims, 8 Drawing Sheets

PRIOR ART

ELECTRONIC CHIP MODULE

CROSS-REFERENCE TO RELATED APPLICATIONS

This application claims the priority of Korean Patent Application No. 2008-0073127 filed on Jul. 25, 2008, in the Korean Intellectual Property Office, the disclosure of which is incorporated herein by reference.

BACKGROUND OF THE INVENTION

1. Field of the Invention

The present invention relates to electronic chip modules, and more particularly, to an electronic chip module that can improve heat dissipation.

2. Description of the Related Art

Recently, the use of electronic components, such as integrated circuits (ICs), improves convenience and leads to a reduction in size, weight, and thickness of electronics, such as cellular phones or personal digital assistants (PDAs).

In order to achieve the reduction in size, weight, and thickness of the electronics, the electronic components need to be reduced in size, weight, and thickness, and a multi-chip module having these electronic components mounted therein also needs to be reduced in size, weight, and thickness. Therefore, a heat dissipation mechanism of the entire multi-chip module is a major consideration when achieving the reduction in size, weight, and thickness of the entire multi-chip module mounted with the electronic components.

That is, since heat-generating devices, such as a power module and an IC chip, produce high temperature heat, thermal dissipation units, such as heat sinks, are used to prevent malfunction of the electronics. This heat sink is attached to a rear surface of a board onto which wires connected to the multi-chip module are printed.

The board has a plurality of heat-generating devices mounted on a major surface, a plurality of thermal vias provided at positions of the board where the heat-generating devices are mounted, and a heat sink provided on another major surface opposite to the one major surface with a resin layer interposed therebetween. The heat sink dissipates heat through the thermal vias. Further, heat dissipation efficiency is increased by using a board formed of ceramic or alumina with high thermal conductivity.

However, when heat generated from the heat-generating devices is transmitted to the board, the resin layer, and the heat sink, the thermal conductivity is significantly reduced since the individual components are formed of different materials from each other. Particularly, the resin layer used to bond the heat sink to the board onto which the wires are printed causes a significant reduction in thermal conductivity while the heat is transferred from the board to the heat sink. That is, thermal loss occurs. Therefore, the above-described thermal dissipation mechanism cannot be expected to provide sufficient heat dissipation because of poor heat dissipation of thermal resin.

SUMMARY OF THE INVENTION

An aspect of the present invention provides an electronic chip module that can increase heat dissipation efficiency by ensuring a heat path through which heat generated during the operation of a heat-generating device chip is dissipated to the outside to reduce heat transfer loss by forming a metal wire with excellent thermal conductivity by using wire bonding or a similar method to this method on a region of a bottom surface of a module circuit board mounted with the heat-generating device chip, the region where a thermal via is formed, and allowing the module circuit board to be in direct contact with a heat sink.

According to an aspect of the present invention, there is provided an electronic chip module including: a heat-generating device chip; a module circuit board having a first surface mounted with the heat-generating device chip, a second surface opposite to the first surface, and at least one thermal via passing through regions of the first and second surfaces where the heat-generating device chip is formed; a bonding resin layer attached to the second surface of the module circuit board; a heat sink attached to a bottom surface of the bonding resin layer, and having the module circuit board mounted thereon with the bonding resin layer interposed therebetween; and a metal wire provided on the region of the second surface where Thermal via is provided so that the metal wire is exposed on the bottom surface of the bonding resin layer and is in direct contact with the heat sink.

The electronic chip module may further include a metal heat plate between the metal wire and the region of the second surface of the module circuit board where Thermal via is provided.

An additional circuit pattern and a passive device may be further provided on the second surface of the module circuit board.

The passive device may be a thick film resistor.

The bonding resin layer may be formed of insulating epoxy resin.

The bonding resin layer may be formed of conductive epoxy resin.

The insulating units may be further provided on the passive device and the metal heat plate.

The insulating unit may be an overglaze layer applied to cover the passive device and the metal heat plate.

The module circuit board may be a ceramic board.

An additional element may be mounted onto the first surface of the module circuit board.

The metal wire may be formed by wire bonding.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Figure 1:
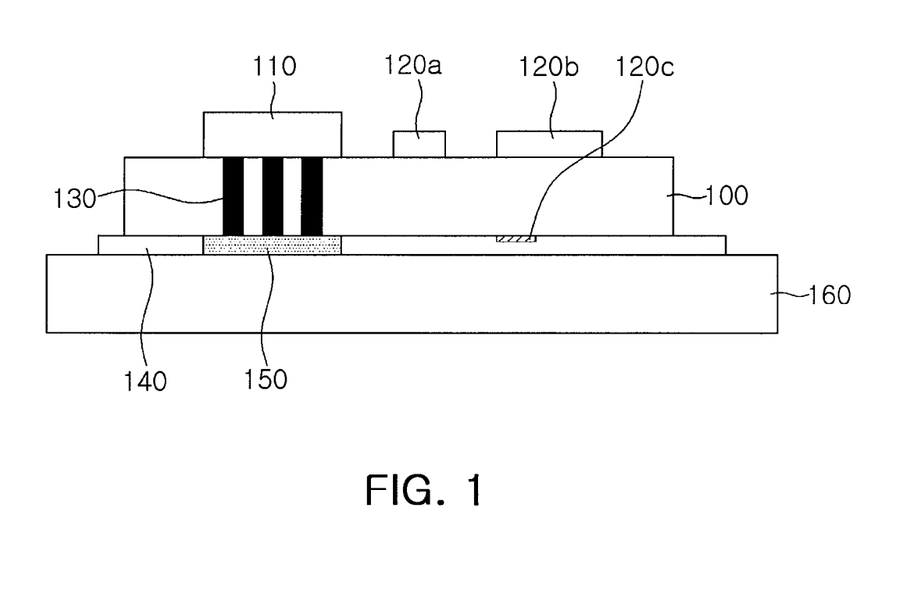
FIG. 1 is a vertical cross-sectional view illustrating an electronic chip module according to an exemplary embodiment of the invention.

FIG. 1 is a vertical cross-sectional view illustrating an electronic chip module according to an exemplary embodiment of the invention. As shown in FIG. 1, the electronic chip module according this embodiment includes a circuit board 100 for a module (hereinafter, referred to as a "module circuit board 100"), one or more thermal vias 130, a bonding resin layer 140, a heat sink 160, and at least one metal wire 150. The module circuit board 100 is circuit board for module and has a first surface on which a heat-generating device chip 110 is mounted. The thermal vias 130 pass through the circuit board 100. The bonding resin layer 140 is formed on a second surface opposite to the first surface of the module circuit board 100. The heat sink 160 is bonded to the second surface of the module circuit board 100 with the bonding resin layer 140 interposed therebetween. While at least one metal wire 150 is formed on a region of the second surface of the module circuit board 100 where the thermal vias 130 are formed, the metal wire 150 passes through the bonding resin layer 140 and is in direct contact with the heat sink 160.

The module circuit board 100 includes at least one thermal via 130 that passes through regions of the first and second surfaces on which the heat-generating device chip 110 is mounted. The heat-generating device chip 110 is formed on the region of the first surface of the module circuit board 100 where the thermal vias 130 are formed. The module circuit board 100 may be a ceramic board (LTCC). Additional devices 120a and 120b as well as the heat-generating device may be mounted onto the first surface of the module circuit board 100. Further, an additional circuit pattern and a passive device 120, such as a thick film resistor, may also be formed on the second surface of the module circuit board 100.

The bonding resin layer 140 bonds the second surface of the module circuit board 100 to an upper surface of the heat sink 160. The bonding resin layer 140 is formed of, for example, insulating epoxy resin for heat dissipation. The bonding resin layer 140 prevents direct contact between the heat sink 160, and the additional circuit pattern and the passive device 120c formed on the second surface of the module circuit board 100. That is, if the passive device 120c is in direct contact with the heat sink 160, a short circuit is caused between wires connected electrically to each other. In order to prevent this, the bonding resin layer 140 has a predetermined thickness.

The metal wire 150 is formed on the region of the second surface of the module circuit board 100, where the thermal vias 130 are formed, by wire bonding. The metal wire 150 passes through the bonding resin layer 140 and is in direct contact with the heat sink 160. A wire is likely to be bent by a low force. For this reason, when the module circuit board 100 is attached to the bonding resin layer dispensed onto the upper surface of the heat sink 160, if a slight force is applied, the wire comes in contact between the board 100 and the heat sink 160.

Specifically, the one or more metal wires 150 are bonded to the second surface of the module circuit board 100 at predetermined intervals, the metal wires 150 are then placed so as to be bonded to the bonding resin layer 140 formed on the upper surface of the heat sink 160, and the metal wires 150 are pressurized against the bonding resin layer 140. Here, the bonding resin layer 140 is interposed between the plurality of metal wires 150, is exposed to the bonding resin layer 140 to pass through the bonding resin layer 140, and is in direct contact with the heat sink 160.

A wire used as the metal wire 150 generally has a thickness of 20 to 100 μm. That is, the metal wire 150 is thick enough so that the passive device 120c, formed on the second surface of the module circuit board 100, is not in contact with the heat sink 160. Therefore, the heat generated during the operation of the heat-generating device chip 110 can be efficiently dissipated using the metal wire 150. Furthermore, the addition circuit pattern and the passive device 120c formed on the second surface of the module circuit board 100 are not in contact with the heat sink 160, thereby preventing a short circuit.

The electronic chip module according to this embodiment can be applied to a case in which a metal heat plate is provided on the region of the second surface of the module circuit board 100, where the thermal via 130 are formed. In this case, the metal wire 150 is bonded to the metal heat plate. Here, the bonding resin layer 140 is formed of insulating epoxy resin. That is, the metal heat plate is further added between the metal wire 150 and the second surface of the module circuit board 100, where the thermal via 130 is formed, thereby increasing the heat dissipation efficiency. This will be described in more detail with reference to FIGS. 3 and 4.

The electronic chip module according to this embodiment also can be applied to a case in which overglaze layers are further applied to the metal heat plate, formed on the thermal via 130 in the second surface of the module circuit board 100, and the passive device 120c, formed on the second surface of the module circuit board 100. In this case, the metal wire 150 is bonded to the overglaze layer applied over the metal heat plate, and is in direct contact with the heat sink 160. The bonding resin layer 140 may be formed of insulating epoxy resin or conductive epoxy resin. This will be described in more detail with reference to FIGS. 6 and 7.

Therefore, in this embodiment, the metal wires are bonded to the overglaze layers, the metal heat plate, or the thermal vias formed in the second surface of the module circuit board, such that the module circuit board mounted with the heat-generating device chip and the heat sink can be in direct contact with each other. Metal has a maximum of several hundreds times higher thermal conductivity than nonmetal. When a metal wire using metal is used, heat generated during the operation of the heat-generating device chip can be effectively transferred to the heat sink.

Figure 2A:
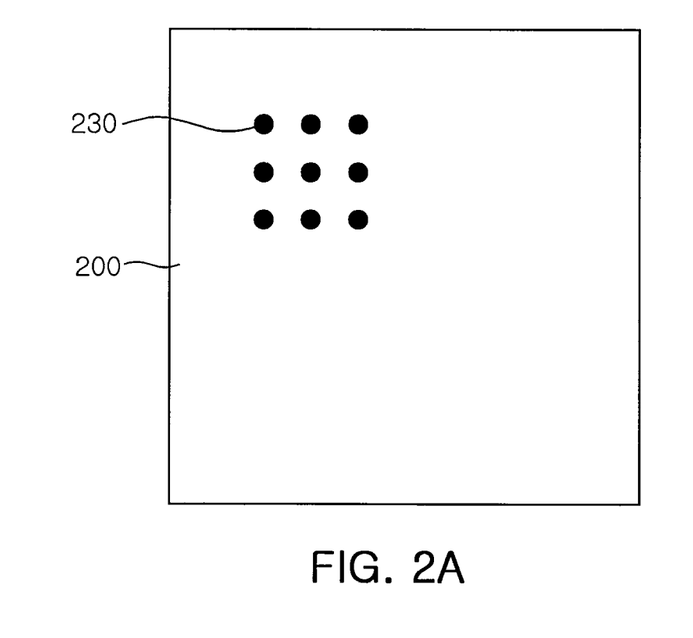
FIGS. 2A and 2B are plan views illustrating before and after metal wires are formed on a second surface of a module circuit board of the electronic chip module according to the embodiment illustrated in FIG. 1.
Figure 2B:
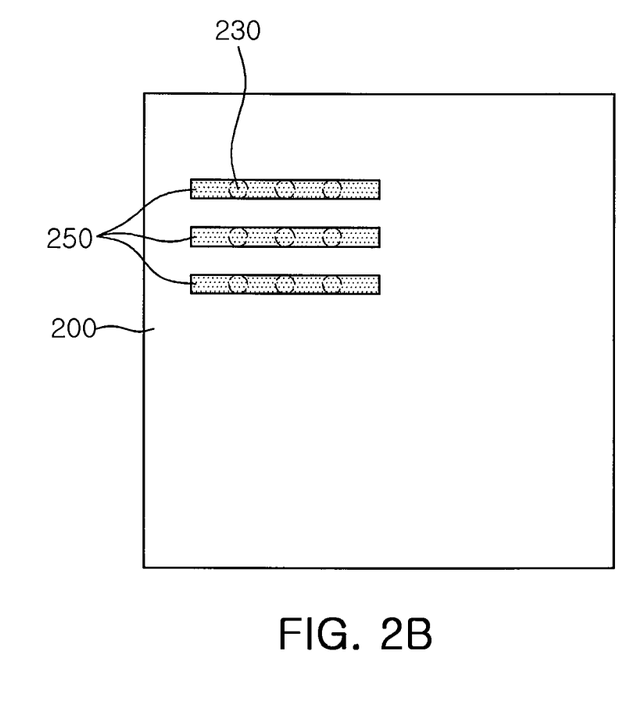

FIGS. 2A and 2B are plan views illustrating before and after metal wires are formed on the second surface of the module circuit board of the electronic chip module according to the embodiment illustrated in FIG. 1.

Referring to FIG. 2A, one or thermal vias 230 are formed in a region of a second surface of a module circuit board 200. A heat-generating device chip is mounted on a first surface of the module circuit board 200. The first surface opposite to the region of the second surface of the module circuit board 200 where the thermal vias 230 are formed.

Referring to FIG. 2B, one or more metal wires 250 that connect the thermal vias 230 formed in the region of the second surface of the module circuit board 200 are separated by intervals.

Figure 3:
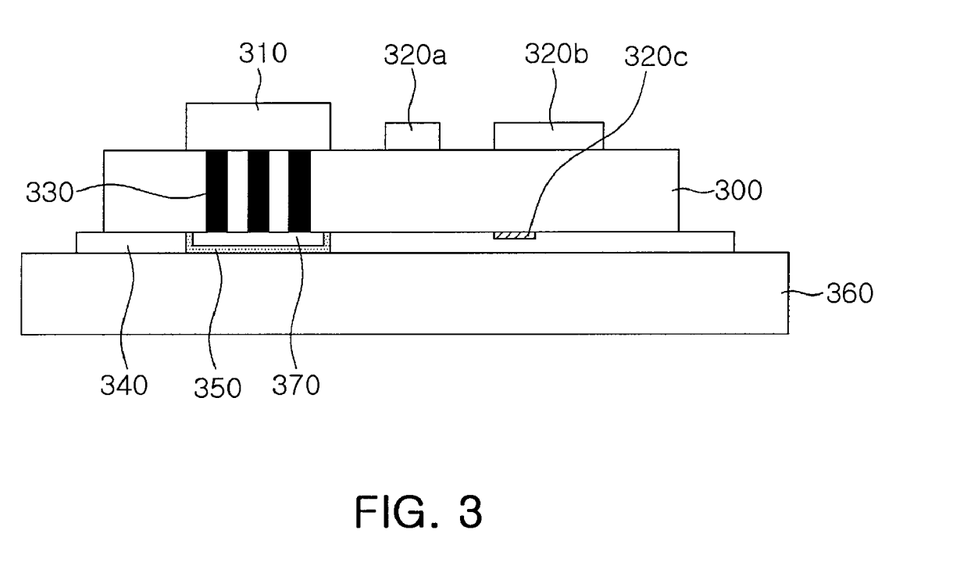
FIG. 3 is a vertical cross-sectional view illustrating an electronic chip module according to another exemplary embodiment of the invention.

FIG. 3 is a vertical cross-sectional view illustrating an electronic chip module according to another exemplary embodiment of the invention. As shown in FIG. 3, an electronic chip module according to this embodiment includes a module circuit board 300, one or more thermal vias 330, a metal heat plate 370, a bonding resin layer 340, a heat sink 360, and one or more metal wires 350. The module circuit board 300 has a heat-generating device chip 310 on a first surface thereof. The thermal vias 330 are formed through a region of the module circuit board 300, where the heat-generating device chip 310 is mounted. The metal heat plate 370 is in contact with the thermal vias 330 formed through the second surface opposite to the first surface of the module circuit board 300. The resin layer 340 is bonded to the second surface of the module circuit board 300. The heat sink 360 is bonded to the second surface of the module circuit board 300 with the bonding resin layer 340 interposed therebetween. The metal wires 350 are bonded to the metal heat plate 370, pass through the bonding resin layer 340, and are in direct contact with the heat sink 360.

The module circuit board 300 has at least one thermal via 330 that passes through the first surface and the second surface thereof. The heat-generating device chip 310 is mounted on the region of the first surface of the module circuit board 300, where the thermal via 330 is formed. The module circuit board 300 may be a ceramic board (LTCC). Additional devices 320a and 320b as well as the heat-generating device may be mounted onto the first surface of the module circuit board 300. Further, an additional circuit pattern and a passive device 320c, such as a thick film resistor, may be formed on the second surface of the module circuit board 300.

The bonding resin layer 340 bonds the second surface of the module circuit board 300 and an upper surface of the heat sink 360 to each other. Preferably, the bonding resin layer 340 is formed of insulating, thermal epoxy resin. The bonding resin layer 340 prevents the heat sink 360 from being indirect contact with the additional circuit pattern and the passive device 320c formed on the second surface of the module circuit board 300. That is, when the passive device 320c is in direct contact with the heat sink 360, electrical connection between wires may cause a short circuit. To prevent this, the bonding resin layer 340 has a predetermined thickness.

The metal wires 350 are formed on the metal heat plate 370 of the second surface of the module circuit board 300 by wire bonding. The metal wires 350 pass through the bonding resin layer 340 and are in direct contact with the heat sink 360. A wire is likely to be bent by a low force. For this reason, when the module circuit board is attached to the bonding resin layer dispensed onto the upper surface of the heat sink, if a slight force is applied, the wire becomes naturally in contact between the board and the heat sink.

Specifically, the metal wires 350 are bonded to the module circuit board 300 at intervals, placed so as to be bonded to the bonding resin layer 340 formed on the upper surface of the heat sink 360, and then pressurized against the bonding resin layer 340. Then, the bonding resin layer 340 becomes interposed between the plurality of metal wires 350, the metal wires 350 are exposed to pass through the bonding resin layer 340, and finally is in direct contact with the heat sink 360.

In general, the metal wire 350 is a wire with a thickness of approximately 20 to 100 μm. That is, the metal wires 350 are thick enough so that the passive device 320c, formed on the second surface of the module circuit board 300, is not in contact with the heat sink 360. Therefore, the heat dissipation efficiency with respect to the heat generated during the operation of the heat-generating device chip 310 can be improved by the metal wires 350. Further, the metal wires 350 prevent the heat sink 360 from being in direct contact with the additional circuit pattern and the passive device 320c formed on the second surface of the module circuit board 300.

Figure 4A:
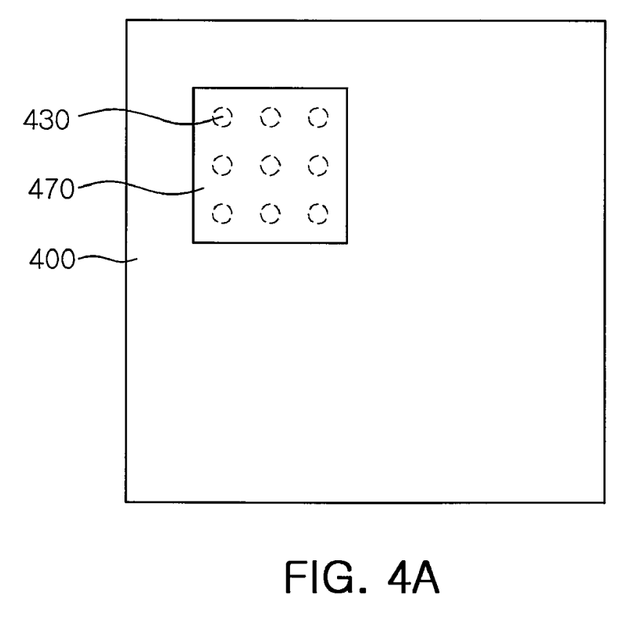
FIGS. 4A and 4B are plan views illustrating before and after metal wires are formed on a second surface of the electronic chip module according to the embodiment illustrated in FIG. 3.
Figure 4B:
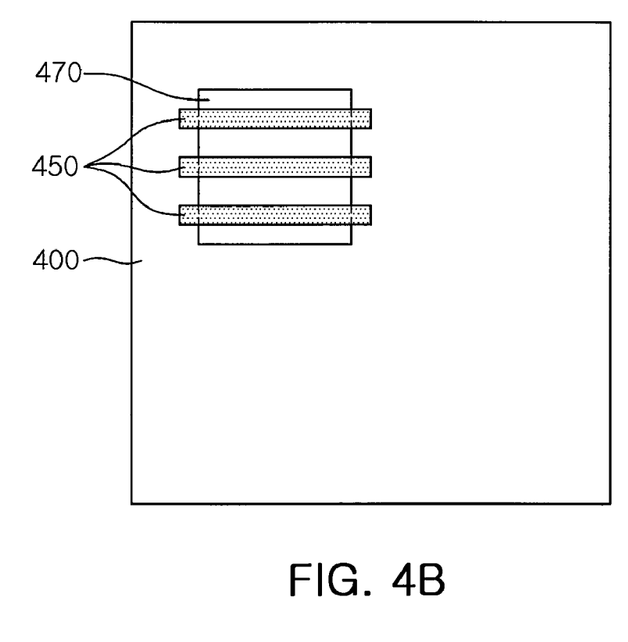

FIGS. 4A and 4B are plan views illustrating before and after the metal wires are formed on the second surface of the electronic chip module according to the embodiment illustrated in FIG. 3.

Referring to FIG. 4A, thermal vias 430 are formed through a region of a second surface of a module circuit board 400. A metal heat plate 470 is placed in contact with the region where thermal vias 430 are formed.

Referring to FIG. 4B, one or more metal wires 450 are bonded to the metal heat plate 470 at intervals.

Figure 5:
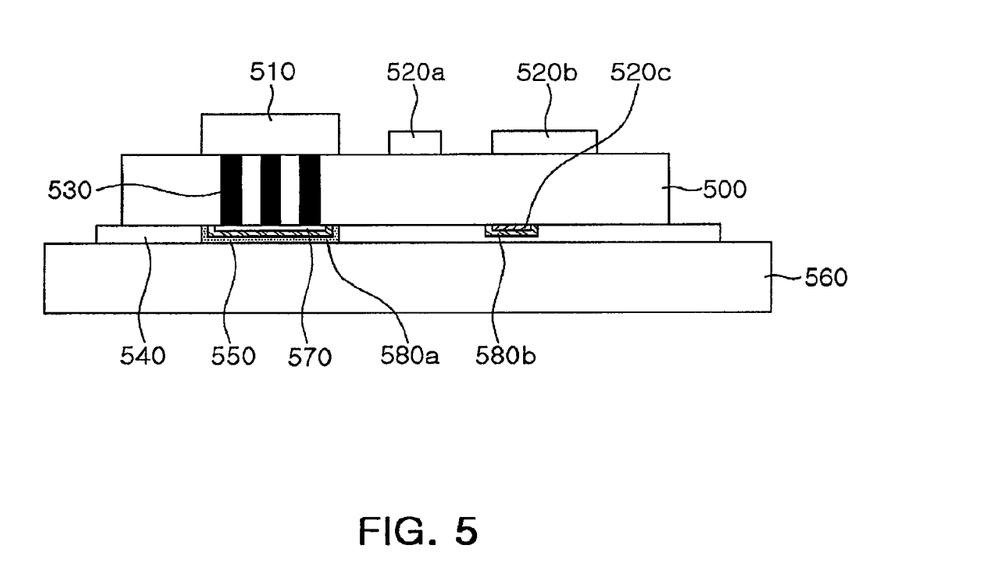
FIG. 5 is a vertical cross-sectional view illustrating an electronic chip module according to still another exemplary embodiment of the invention.

FIG. 5 is a vertical cross-sectional view illustrating an electronic chip module according to still another exemplary embodiment of the invention. As shown in FIG. 5, an electronic chip module according to this embodiment includes a module circuit board 500, one or more thermal vias 530, a metal heat plate 570, an insulating unit 580a, a bonding resin layer 540, a heat sink 560, and one or more metal wires 550. The module circuit board 500 has a heat-generating device chip 510 on a first surface thereof. The thermal vias 530 are formed through the region of the module circuit board 500 where the heat-generating device chip 510 is mounted. The metal heat plate 570 is formed on the thermal vias 530 formed through a second surface opposite to the first surface of the module circuit board 500. The insulating unit 580a is applied to the metal heat plate 570. The bonding resin layer 540 is bonded to the second surface of the module circuit board 500. The heat sink 560 is bonded to the second surface of the module circuit board 500 with the bonding resin layer 540 interposed therebetween. One or more metal wires 550 are formed on the insulating unit 580a of the second surface of the module circuit board 500, pass through the bonding resin layer 540, and are in direct contact with the heat sink 560.

The module circuit board 500 has the one or more thermal vias 530 that pass through the first surface and the second surface thereof. The heat-generating device chip 510 is mounted onto the region of the first surface of the module circuit board 500, where the thermal vias 530 are formed. The module circuit board 500 may be a ceramic substrate. Additional devices (520a and 520b) as well as the heat-generating device may be mounted onto the first surface of the module circuit board 500. Further, an additional circuit pattern and a passive device 520c, such as a thick film resistor, may be formed on the second surface of the module circuit board 500. The insulating unit 580b is applied to the passive device 520c.

The bonding resin layer 540 bonds the second surface of the module circuit board 500 to an upper surface of the heat sink 560, and is formed of conductive epoxy resin to improve heat dissipation. That is, in order to use conductive epoxy resin for the bonding resin layer 540, the insulating units 580a and 580b are applied to the metal heat plate 570 and the passive device 520c formed on the second surface of the module circuit board 500. Since the insulating units 580a and 580b are applied, the bonding resin layer 540 may be formed of insulating epoxy resin. Overglaze layers may be used as the insulating units 580a and 580b.

The metal wire 550 is formed on the insulating unit 580a of the second surface of the module circuit board 500 by wire bonding. The metal wire 550 passes through the bonding resin layer 540 and is in direct contact with the heat sink 560. A wire is likely to be bent by a low force. Therefore, when the module circuit board is attached to the bonding resin layer dispensed onto the upper surface of the heat sink, if a slight force is applied, the wire comes in contact between the board and the heat sink.

Specifically, the plurality of metal wires 550, which are bonded to the insulating unit 580a and separated from each other by predetermined intervals, are placed and bonded to the bonding resin layer 540 formed on the upper surface of the heat sink 560, and then pressurized against the bonding metal layer 540. Then, the bonding resin layer 540 is interposed between the plurality of metal wires 550, and the metal wires 550 are exposed to pass through the bonding resin layer 540. The metal wires 550 are in direct contact with the heat sink 560. The bonded metal wire 550 can improve the heat dissipation efficiency with respect to the heat generated during the operation of the heat-generating device chip 510.

Figure 6A:
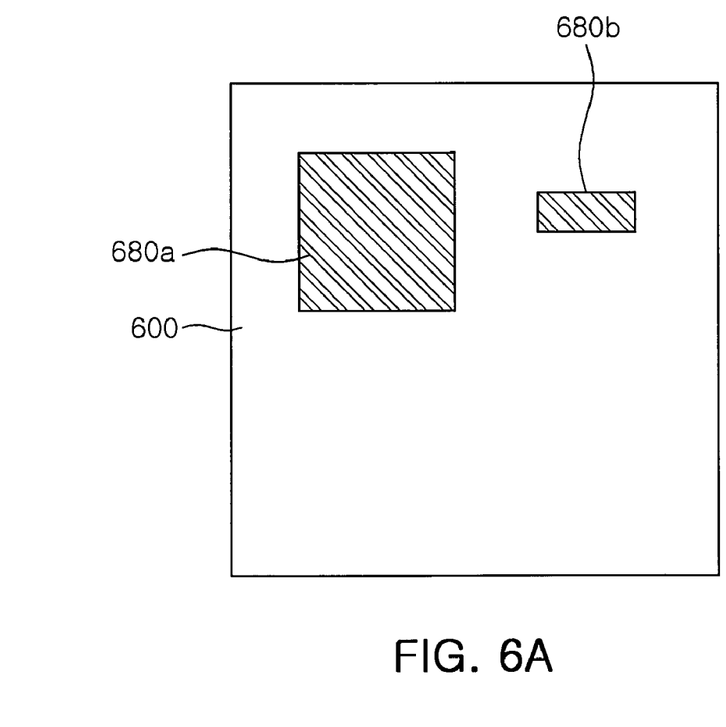
FIGS. 6A and 6B are plan views illustrating before and after metal wires are formed on a second surface of the electronic chip module according to the embodiment illustrated according to FIG. 5.
Figure 6B:
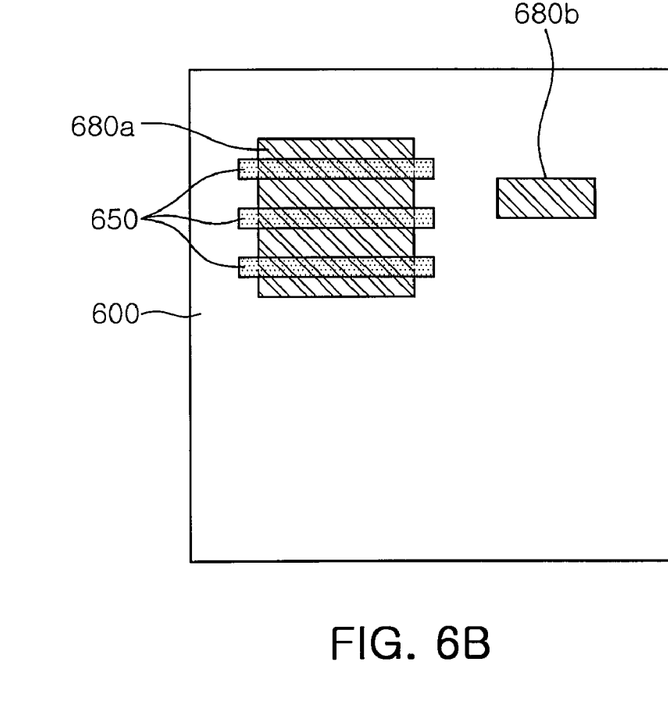

FIGS. 6A and 6B are plan views illustrating before and after metal wires are formed on the second surface of the electronic chip module according to the embodiment illustrated in FIG. 5.

Referring to FIG. 6A, one or more thermal vias 630 are formed through a region of a second surface of a module circuit board 600, and a metal heat plate is formed on the region of the module circuit board 600 where the thermal vias are formed. Insulating units 680a and 680b are formed to cover the metal heat plate and a passive device. The insulating units 680a and 680b may be overglaze layers.

Referring to FIG. 6B, one or more metal wires 650 are formed on the insulating unit 680a formed on the metal heat plate by a bonding method, and are separated by intervals.

Figure 7:
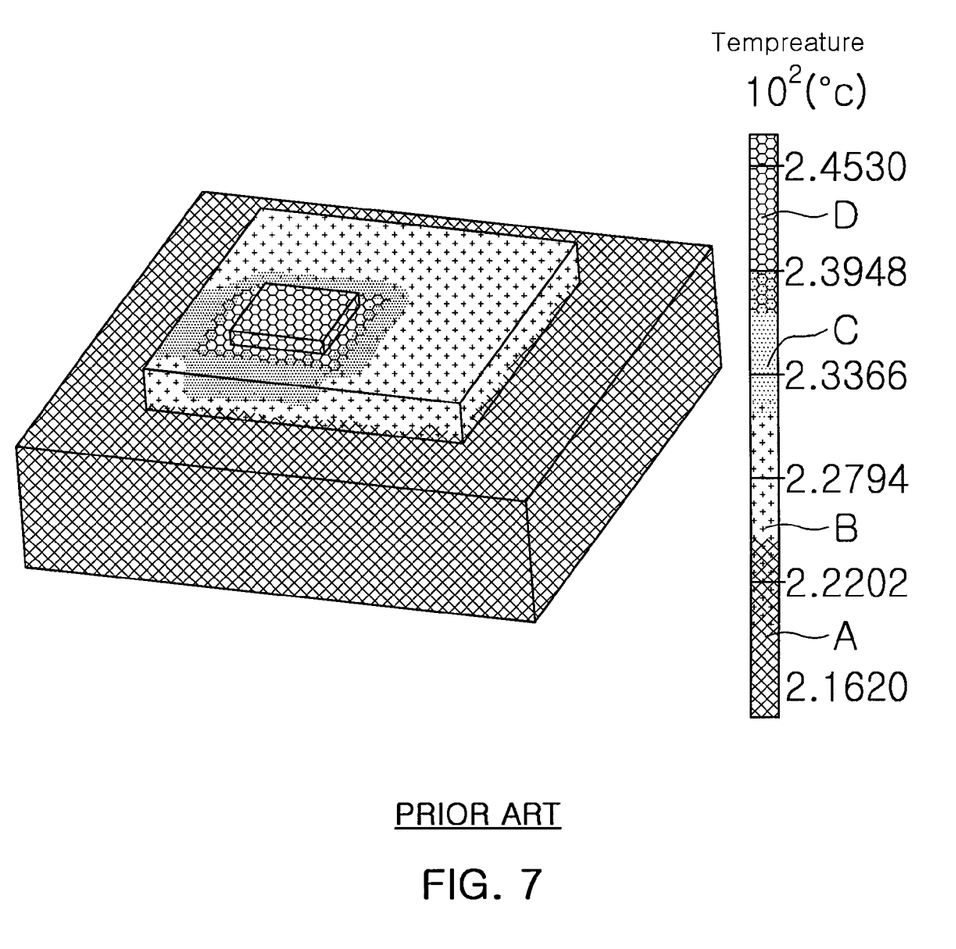
FIG. 7 is a view illustrating simulation results showing a heat dissipation effect of a general multi-chip module that only has a heat sink according to the related art.

FIG. 7 is a view illustrating simulation results showing a heat dissipation effect of a general multi-chip module that only has a heat sink. The simulation is performed under conditions in which a heat-generating device has a heat transfer coefficient (W/m ° C.) of 110, a thermal via filled with Ag has a heat transfer coefficient of 427, a ceramic board mounted with the heat-generating device has a heat transfer coefficient of 3, thermal epoxy has a heat transfer coefficient of 207, and a heat sink formed of Al has a heat transfer coefficient of 237. The heat-generating device has an electrical performance of ID=65 A and RDS=3 mΩ, and ambient temperature is 25° C.

As shown in FIG. 7, according to the simulation results, in the multi-chip module that only has the heat sink, the heat-generating device mounted onto the board has a maximum temperature of 245° C., temperature is in a region D, and the heat sink has a temperature in a region A. That is, it can be shown that heat generated from the heat-generating device is not smoothly dissipated to the heat sink.

Figure 8:
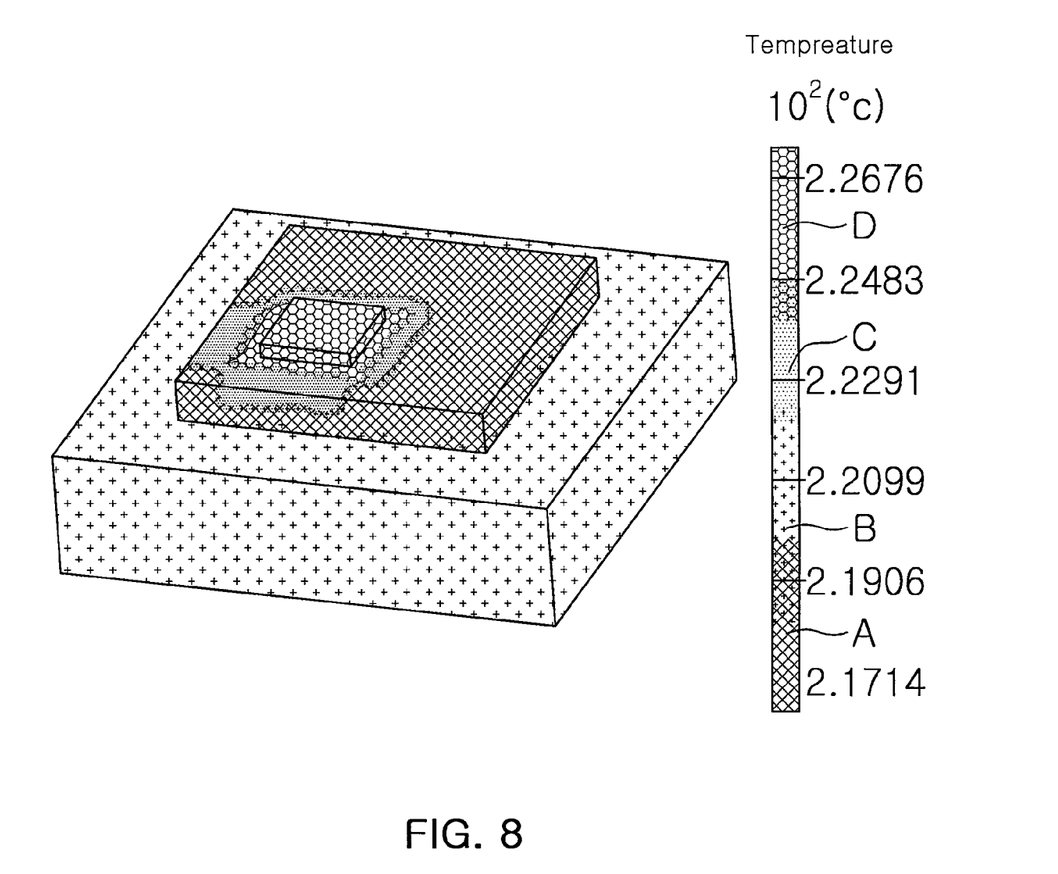
FIG. 8 is a view illustrating simulation results showing heat dissipation effects of the electronic chip modules according to the embodiments illustrated in FIGS. 1, 3, and 5.

FIG. 8 is a view illustrating simulation results showing heat dissipation effects of the electronic chip modules according to the embodiments illustrated in FIGS. 1, 3, and 5. The simulation conditions are the same as those of the general multi-chip module having the heat sink in FIG. 7. Further, a metal heat plate (Al) has a heat transfer coefficient (W/m ° C.) of 237, and a metal wire (Al) has a heat transfer coefficient (W/m ° C.) of 237.

As shown in FIG. 8, according to the simulation results, the heat-generating device chip has a maximum temperature of 226° C., temperature is in a region D, ambient temperature of a heat-generating device chip mounted onto the board is in regions B and C, and a heat sink has a temperature in a region B. That is, heat generated from the heat-generating device chip is smoothly transmitted to the heat sink, such that the temperature of the heat sink is increased.

Therefore, it can be seen from the simulation results, shown in FIGS. 7 and 8, when the same voltage is applied to the heat-generating device, the electronic chip module according to the embodiments of the invention has more excellent heat dissipation efficiency than the general electronic chip module. That is, the maximum temperature of the heat-generating device chip of the electronic chip module according to the embodiments of the invention is 19° C. higher than that of the general electronic chip module that only has the heat sink.

As set forth above, according to exemplary embodiments of the invention, a metal wire is formed on a bottom surface of a module circuit board having a heat-generating device chip mounted thereon, and is in direct contact with a heat sink, such that thermal conductivity allowing heat, generated during the operation of the heat-generating device chip, to be dissipated to the heat sink is increased. Accordingly, heat dissipation efficiency can be easily increased without changing the size of the heat sink and design. Further, the increase in heat dissipation efficiency results in a reduction in size of the heat sink to thereby reduce costs.

While the present invention has been shown and described in connection with the exemplary embodiments, it will be apparent to those skilled in the art that modifications and variations can be made without departing from the spirit and scope of the invention as defined by the appended claims.

What is claimed is:

1. An electronic chip module comprising:
a heat-generating device chip;
a module circuit board having a first surface mounted with the heat-generating device chip, a second surface opposite to the first surface, and at least one thermal via passing through a region of the first and second surfaces where the heat-generating device chip is mounted;
a bonding resin layer attached to the second surface of the module circuit board;
a heat sink attached to a bottom surface of the bonding resin layer, and having the module circuit board mounted thereon with the bonding resin layer interposed therebetween; and
a metal wire provided on the region of the second surface where the at least one thermal via is provided so that the metal wire is exposed on the bottom surface of the bonding resin layer and is in direct contact with the heat sink.

2. The electronic chip module of claim 1, further comprising a metal heat plate between the metal wire and the region of the second surface of the module circuit board where the thermal via is provided.

3. The electronic chip module of claim 2, wherein an additional circuit pattern and a passive device are further provided on the second surface of the module circuit board.

4. The electronic chip module of claim 3, wherein the passive device is a thick film resistor.

5. The electronic chip module of claim 4, wherein the bonding resin layer is formed of insulating epoxy resin.

6. The electronic chip module of claim 4, wherein the bonding resin layer is formed of conductive epoxy resin.

7. The electronic chip module of claim 6, wherein insulating units are further provided on the passive device and the metal heat plate.

8. The electronic chip module of claim 7, wherein each insulating unit is an overglaze layer applied to cover the passive device and the metal heat plate.

9. The electronic chip module of claim 1, wherein the module circuit board is a ceramic board.

10. The electronic chip module of claim 1, wherein an additional element may be mounted onto the first surface of the module circuit board.

11. The electronic chip module of claim 1, wherein the metal wire is formed by wire bonding.

* * * * *